(12) United States Patent
Wang et al.

(10) Patent No.: US 10,281,490 B2
(45) Date of Patent: May 7, 2019

(54) TESTING PROBE FOR TESTING LIQUID CRYSTAL SCREEN AND TESTING DEVICE COMPRISING THE SAME

(71) Applicants: BOE Technology Group Co., Ltd., Beijing (CN); BEIJING BOE OPTOELECTRONICS TECHNOLOGY CO., LTD., Beijing (CN)

(72) Inventors: Xuepeng Wang, Beijing (CN); Zhaowei Yin, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/769,782

(22) PCT Filed: May 13, 2015

(86) PCT No.: PCT/CN2015/078861
§ 371 (c)(1),
(2) Date: Aug. 21, 2015

(87) PCT Pub. No.: WO2016/090843
PCT Pub. Date: Jun. 16, 2016

(65) Prior Publication Data
US 2017/0315151 A1    Nov. 2, 2017

(30) Foreign Application Priority Data
Dec. 9, 2014  (CN) .......................... 2014 1 0748723

(51) Int. Cl.
*G01R 1/067*   (2006.01)
*G02F 1/13*    (2006.01)

(52) U.S. Cl.
CPC ....... *G01R 1/06716* (2013.01); *G02F 1/1309* (2013.01)

(58) Field of Classification Search
CPC .. G01R 1/07342; G01R 3/00; G01R 1/06722; G01R 1/06727; G01R 1/06733;
(Continued)

(56) References Cited

U.S. PATENT DOCUMENTS 5,295,839 A * 3/1994 Grange ................. H01R 12/62
                                                        347/50
5,388,997 A * 2/1995 Grange ............. H01R 13/2421
                                                        347/50
(Continued)

FOREIGN PATENT DOCUMENTS

CN    101604499       12/2009
CN    101604499 A     12/2009
(Continued)

OTHER PUBLICATIONS

Office Action in Chinese Application No. 201410748723.X dated May 25, 2017, with English translation.
(Continued)

*Primary Examiner* — Vinh P Nguyen
(74) *Attorney, Agent, or Firm* — Womble Bond Dickinson (US) LLP

(57) ABSTRACT

A testing probe including a base, an elastic extensible element and a probe needle. The probe needle is disposed on the base through the elastic extensible element, and the elastic extensible element is in a stretched state. The testing probe requires only coating silver adhesive on the testing area of the liquid crystal screen previously, eliminating the need to make solder wire, fix solder wire, etc., thereby simplifying preparation before testing and ensuring reliable connections, which greatly reduces testing time and
(Continued)

improves testing efficiency. A testing device including the above testing probe.

10 Claims, 3 Drawing Sheets

(58) Field of Classification Search
CPC .............. G01R 1/0735; G01R 31/2889; G01R 1/06711; G01R 1/07314; G01R 1/07357; G01R 1/07378; G01R 31/2808; G01R 31/2891; G01R 31/001; G01R 31/289; G02F 1/13452; G02F 2001/136254; G02F 1/1309; G02F 1/133; G02F 1/133308; G02F 1/1362; G06F 3/0412; G06F 19/3406; H01L 41/0825
See application file for complete search history.

(56) References Cited

U.S. PATENT DOCUMENTS

| | | | | |
|---|---|---|---|---|
| 5,733,151 | A * | 3/1998 | Edsall | A61B 5/04085 439/67 |
| 6,287,126 | B1 * | 9/2001 | Berger | H01R 4/64 439/65 |
| 7,969,170 | B2 * | 6/2011 | Kazama | G01R 1/06722 324/754.01 |
| 9,674,943 | B2 * | 6/2017 | Oh | H05K 1/0268 |
| 2013/0049785 | A1 | 2/2013 | Cheng | |

FOREIGN PATENT DOCUMENTS

| | | |
|---|---|---|
| CN | 102289090 | 12/2011 |
| CN | 102289090 A | 12/2011 |
| CN | 202650485 | 1/2013 |
| CN | 203011958 | 6/2013 |
| CN | 203011958 U | 6/2013 |
| CN | 104460061 | 3/2015 |
| CN | 204241796 | 4/2015 |
| CN | 204241796 U | 4/2015 |
| JP | H09211048 A | 8/1997 |
| JP | H09251033 | 9/1997 |
| JP | H09251033 A | 9/1997 |

OTHER PUBLICATIONS

Office Action in Chinese Application No. 201410748723.X dated Oct. 8, 2016, with English translation. 8 pages.
International Search Report and Written Opinion with English Language Translation, dated Jun. 29, 2015, Application No. PCT/CN2015/078861.
Office Action in Chinese Application No. 201410748723.X dated Nov. 16, 2017, with English translation.

* cited by examiner

TESTING PROBE FOR TESTING LIQUID CRYSTAL SCREEN AND TESTING DEVICE COMPRISING THE SAME

TECHNICAL FIELD

The invention refers to a technical field of display testing, and specifically to a testing probe and testing device.

BACKGROUND

During manufacturing of liquid crystal display, for guaranteeing product quality, it is normally needed to test for optical parameters (such as VT, RT, etc.) of the product. Currently, optical devices such as DMS9000 are normally employed for testing, and before testing some preparation is needed so as to connect detecting signal lines of the optical device to testing area of the liquid crystal screen, and connection way thereof is as shown in FIG. 1. Specifically, firstly coats silver adhesive 300' on the testing area of the liquid crystal screen 100', and then makes solder wire 400', and fixes the solder wire 400' by paper adhesive tape, and finally connects the detecting signal lines 200' of the optical device to the solder wire 400' by testing clip 500'. The above preparation before testing is very cumbersome, and after the preparation is finished, it can be ensured that during testing the circuits are completely conducting and correct, but on the contrary the phenomena such as open circuit and short circuit occur, and then the situations such as there is not testing data or the testing data is incorrect occur.

SUMMARY

(1) Technical Problem to be Solved

The technical problem to be solved by the invention is providing a testing probe and testing device which can simplify the preparation before testing and improve testing efficiency.

(2) Technical Solution

To solve the above technical solution, the invention provides a testing probe, which is characterized by including a base, an elastic extensible element and a probe needle, the probe needle being disposed on the base through the elastic extensible element, and the elastic extensible element being in a stretched state.

According to an embodiment, the probe needle contacts the base under effect of tension of the elastic extensible element.

According to an embodiment, the base has a depression, and the elastic extensible element is disposed at the depression.

According to an embodiment, the depth of the depression is larger than the height of the elastic extensible element in a nature state.

According to an embodiment, the longitudinal section of the base is of an L-like shape or is concave.

According to an embodiment, the testing probe includes multiple elastic extensile elements.

According to an embodiment, the probe needle is disposed on the base through a first elastic extensile element stretched and a second elastic extensile element compressed.

According to an embodiment, the probe needle includes a needle rod portion and a needle head portion, and the range of the angle between the needle rod portion and the needle head portion is from 90 degree to 160 degree.

According to an embodiment, the tip of the probe needle is at the same level with the bottom of the base or below the level.

According to an embodiment, the testing probe further includes a probe needle carrier for carrying the probe needle, and through the probe needle carrier, the probe needle connects to the elastic extensible element and is disposed on the base.

For solving the above technical problem, the invention further provides a testing device, which includes any one of the above probes.

(3) Beneficial Effect

By the testing probe provided by the invention, only coating silver adhesive on the testing area of the liquid crystal screen previously is needed, and the steps of making solder wire, fixing solder wire, etc. are not needed any more, therefore not only the preparation before testing can be simplified largely, but also reliability of connection is ensured, so as to reduce testing time largely and improve testing efficiency.

DETAIL EMBODIMENTS

Specific implementations of the invention will be further described in detail below in conjunction with the figures and embodiments. The following embodiments are used for illustrating the invention, rather than for limiting the scope of the invention.

An embodiment of the invention provides a testing probe, which includes a base, an elastic extensible element and a probe needle, the probe needle being disposed on the base by the elastic extensible element, and the elastic extensible element being in a stretched state. Specifically, the base has a depression, and the depth of the depression is larger than the height of the elastic extensible element in nature state, and one end of the elastic extensile element is disposed in the depression, and the other end of the elastic extensile element connects with the probe needle, so that make the probe needle contacts the base under effect of tension of the elastic extensile element.

Figure 1:
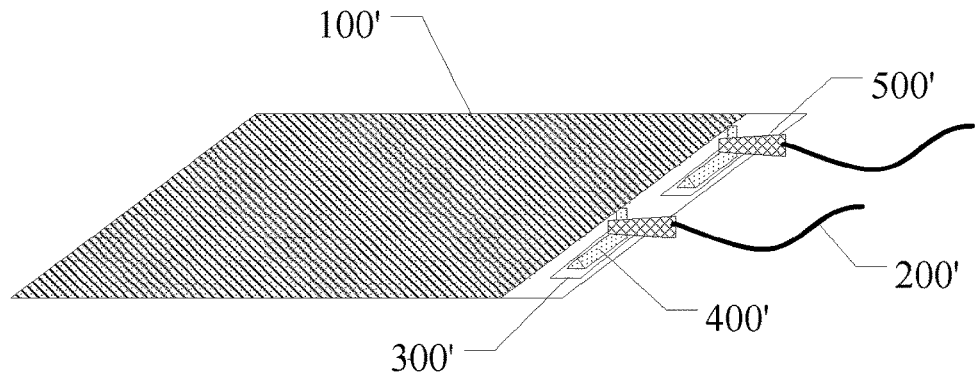
FIG. 1 is a schematic diagram of testing a liquid crystal screen by a optical device in prior art.
Figure 2:
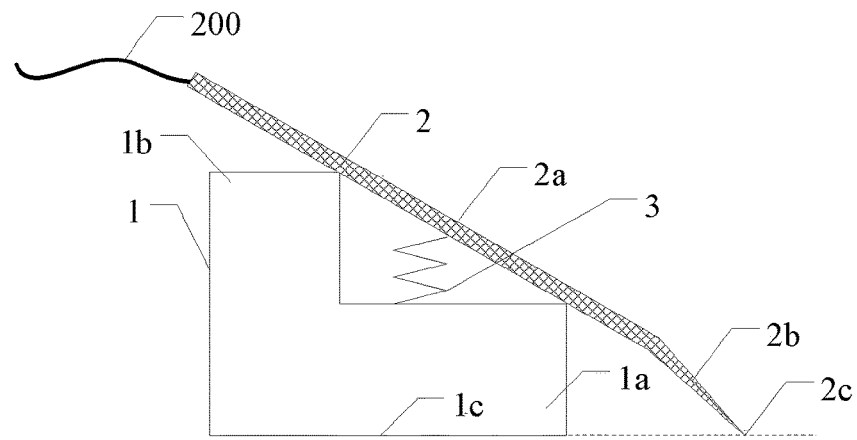
FIG. 2 is a schematic diagram of a first kind of testing probe provided by an embodiment of the invention.

As shown in FIG. 2, the testing probe includes a base 1, an elastic extensile element 3 and a probe needle 2. The longitudinal section of the base is of an L-like shape, and includes a transverse portion 1*a* and a longitudinal portion 1*b*, which form a depression together. One end of the elastic extensile element 3 connects to the depression, and the other end of the elastic extensile element 3 connects to the probe needle 2.

The elastic extensile element 3 may be a spring or any other element which is made of elastic material. Since the depth of the depression is larger than the height of the elastic extensile element 3 in a nature state, the probe needle 2 contacts the base 1 under effect of tension of the elastic extensile element 3.

Figure 3:
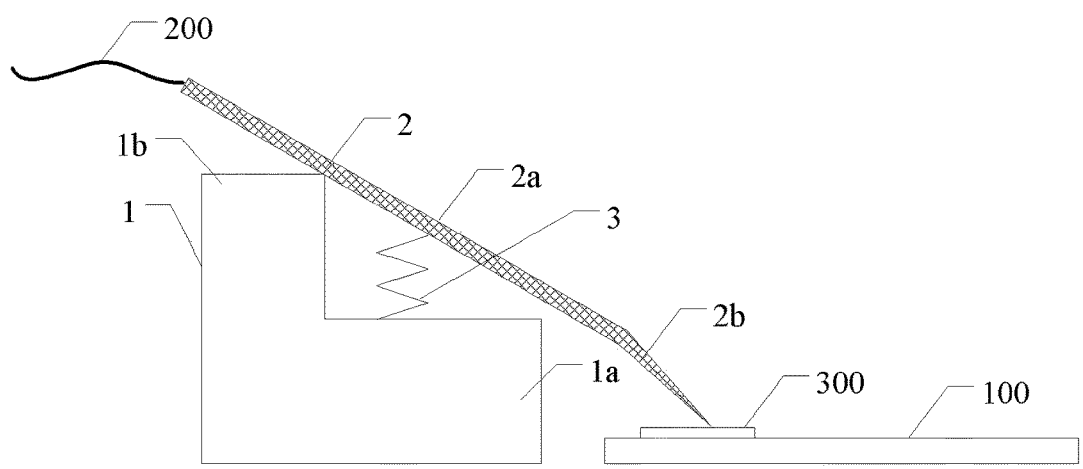
FIG. 3 is a schematic diagram of testing a liquid crystal screen by a testing probe provided by an embodiment of the invention.

As shown in FIG. 3, the probe needle 2 connects with the detecting signal line 200 of the optical device. Before testing the liquid crystal screen 100, coats silver adhesive 300 on the testing area of the liquid crystal screen 100. During testing the liquid crystal screen 100, the needle tip of the probe needle 2 is moved above the testing area coated with silver adhesive 300. The needle tip of the probe needle 2 sticks into the coated silver adhesive 300 under effect of tension of the elastic extensile element 3, so as to realize connection of the optical device and the tested liquid crystal screen.

As shown in FIG. 2, in case of not testing the liquid crystal screen, the needle tip 2*c* of the needle head portion 2*b* is at the same level with bottom 1*c* of the base 1, so as to facilitate the needle tip of the probe needle sticking into the silver adhesive coated on the testing area of the liquid crystal screen successfully during testing of the liquid crystal screen. Alternatively, in case of not testing the liquid crystal screen, the needle tip 2*c* of the needle head portion 2*b* is below the level at which the bottom 1*c* of the base 1 is.

Besides, for increasing the degree of the needle tip 2*c* sticking into the silver adhesive coated on the testing area during testing of the liquid crystal screen, and improving reliability of the connection, in case of not testing the liquid crystal screen, the probe needle 2 contacts the base 1 under effect of tension of the elastic extensile element 3, that is the elastic extensile element 3 is in a stretched state. During testing of the liquid crystal screen, the elastic extensile element 3 is further stretched, so as to increase the tension to which the probe needle is subject, and in turn increase the degree of the needle tip 2*c* sticking into the silver adhesive coated on the testing area.

Figure 4:
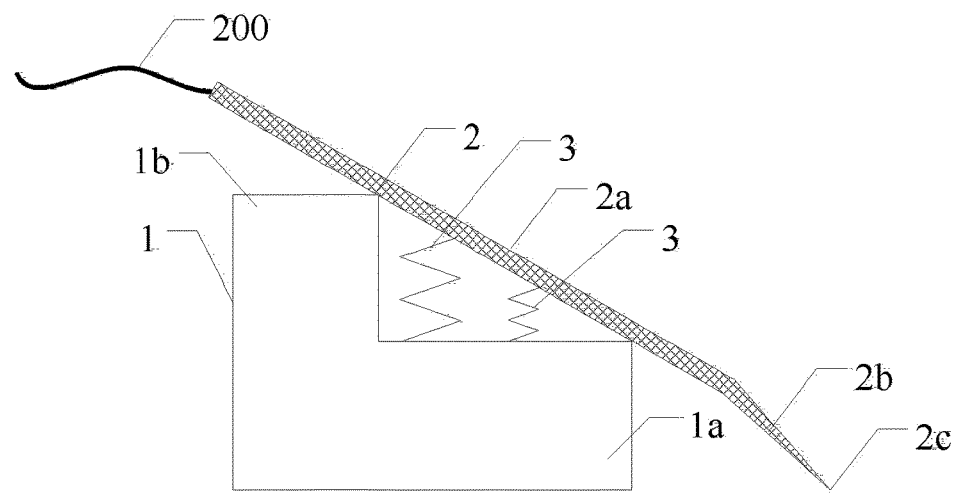
FIG. 4 is a schematic diagram of a second kind of testing probe provided by an embodiment of the invention.

As shown in FIG. 4, the probe needle 2 can be disposed on the base 1 through multiple elastic extensile elements 3. By providing multiple elastic extensile elements, the tension to which the probe needle is subject can be increased largely, so that further increases the degree of the needle tip 2*c* sticking into the silver adhesive coated on the testing area during testing of the liquid crystal screen.

By the testing probe provided by the embodiment of the invention, only coating silver adhesive on the testing area of the liquid crystal screen previously is needed, and the steps of making solder wire, fixing solder wire, etc. are not needed any more. Therefore not only the preparation before testing can be simplified largely, but also reliability of connection is ensured, so as to reduce testing time largely and improve testing efficiency.

Figure 5:
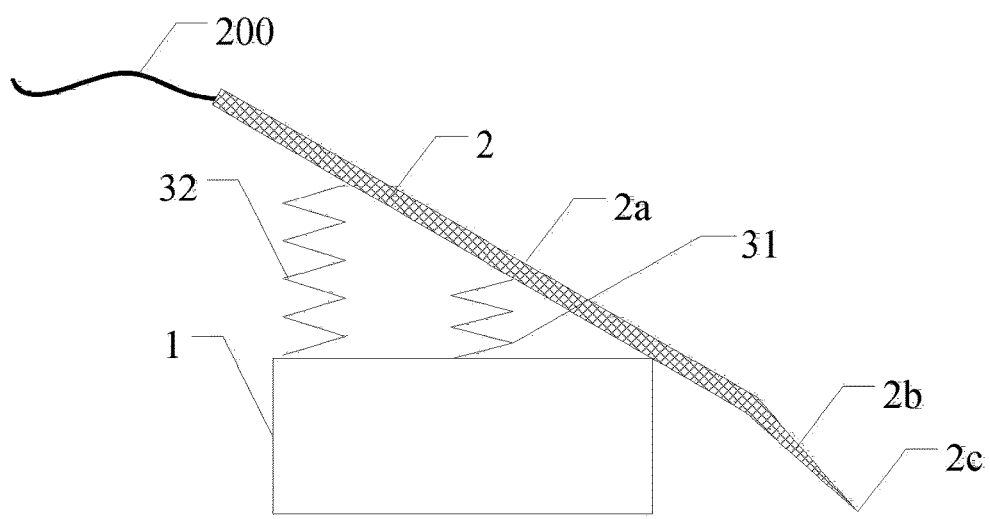
FIG. 5 is a schematic diagram of a third kind of testing probe provided by an embodiment of the invention.

Besides, the longitudinal section of the base in the embodiment of the invention is not only of an L-like shape as shown, but also may be other shapes. See FIG. 5, which is a schematic view of another testing probe provided by an embodiment of the invention. The testing probe includes a base 1 with a section shape of rectangle, a first elastic extensile element 31, a second elastic extensile element 32, and a probe needle 2. Therein, the probe needle 2 is disposed on the base by the first elastic extensile element 31 stretched and the second elastic extensile element 32 compressed. Specifically, when test is not being done, the first elastic extensile element 31 is in a stretched state, and the second elastic extensile element 32 is in a compressed state, and meanwhile the probe needle contacts one end of the base 1 under effect of the two elastic extensile elements, so that the probe needle is subject to supporting force of the base 1 to keep balance. Certainly, it will be understood easily by those skilled in the art, the premise of the balance is that, the two elastic extensile elements can keep extension only in vertical direction in the figure, rather than curve sideways. In testing, the needle tip of the probe needle is raised, making the first elastic extensile element 31 be stretched further, which in turn makes the probe needle be able to stick into the testing area under effect of the tension thereof.

Figure 6:
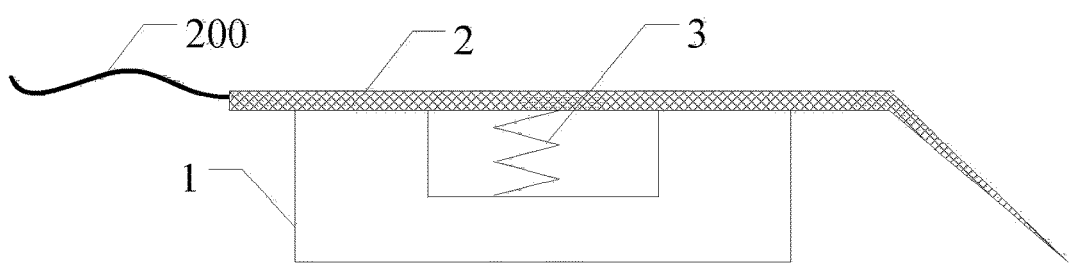
FIG. 6 is a schematic diagram of a fourth kind of testing probe provided by an embodiment of the invention.

See FIG. 6, which is a schematic view of another testing probe provided by an embodiment of the invention. The testing probe includes a base 1 with a longitudinal section shape of concave, an elastic extensile element 3, and a probe needle 2. When not testing the liquid crystal screen, the elastic extensile element 3 is in a stretched state, and the probe needle 2 keeps balance when is subject to the tension of the elastic extensile element 3 and the supporting force of the base 1. During testing the liquid crystal screen, the needle tip of the probe needle is raised, so that make the elastic extensile element be further stretched, which in turn makes the probe needle be able to stick into the silver adhesive coated on the testing area under effect of the tension thereof.

Figure 7:
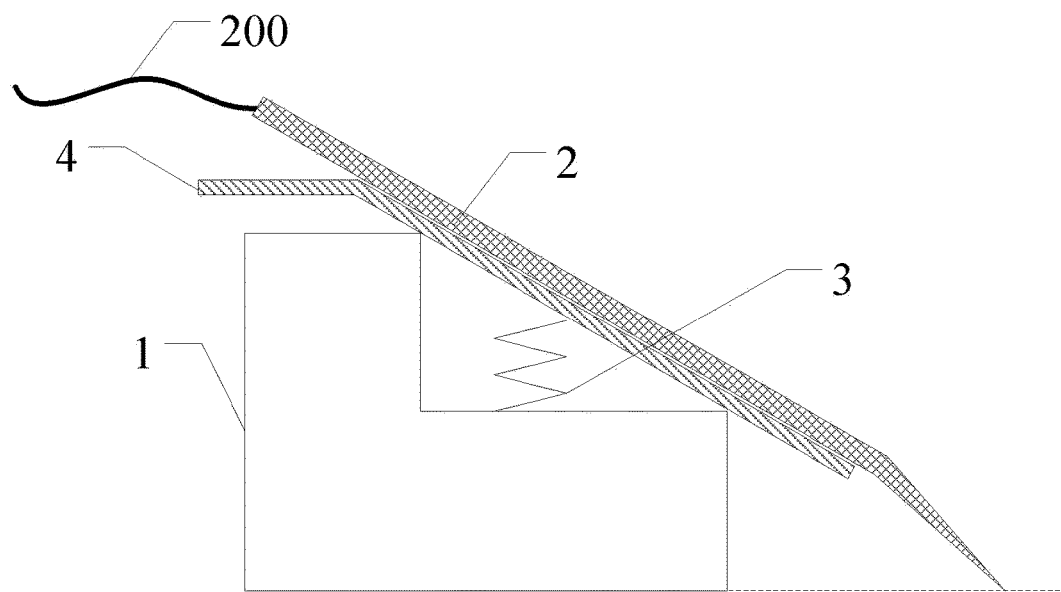
FIG. 7 is a schematic diagram of a fifth kind of testing probe provided by an embodiment of the invention.

For improving the stability of the probe needle during testing the liquid crystal screen, the above testing probe further includes a probe needle carrier for carrying the probe needle. As shown in FIG. 7, the probe needle 2 is disposed on the probe needle carrier 4. For example, one end of the elastic extensile element 3 can be made connect to the base 1, and another end of the elastic extensile element 3 can be made connect to the probe needle 2 through the probe needle carrier 4. By means of the probe needle carrier 4, not only the stability of the probe needle during testing the liquid crystal screen can be improved, but also changing the probe needle is facilitated.

Figure 8:
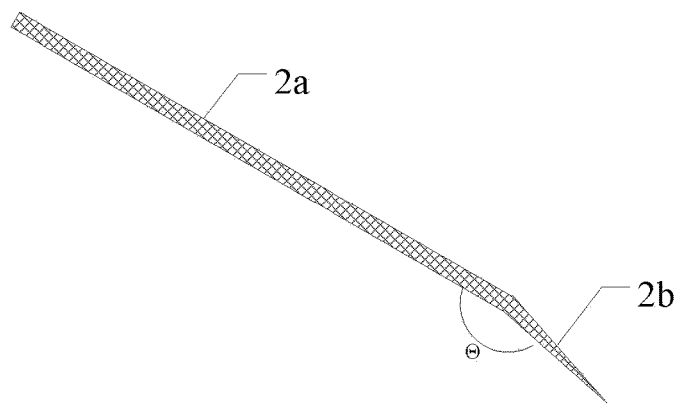
FIG. 8 is a schematic diagram of a probe needle provided by an embodiment of the invention.

For the probe needles in all above embodiments, as shown in FIG. 8, the probe needles 2 include needle rod portions 2*a* and needle head portions 2*b*. In order to facilitate the needle tip of the probe sticking into the silver adhesive coated on the testing area, the range of the angle θ between the needle rod portion 2*a* and the needle head portion 2*b* is from 90 degree to 160 degree, e.g. maybe 100 degree, 130 degree or 150 degree, etc. The angle of the angle θ can be set according to the actual situation. For example, a proper angle can be set, so that the needle tip of the probe needle is at the same level with the bottom of the base in case of not testing the liquid crystal screen. Alternatively, a proper angle can also be set, so that the needle tip of the probe needle is below the level of the bottom of the base when not testing the liquid crystal screen.

Besides, an embodiment of the invention further provides a testing device, which includes any one of the above testing probes.

The above embodiments are used for illustrating but not limiting the invention. Those skilled in the art can make various changes and modifications without departing from the spirit and scope of the invention. Therefore, all equivalent technical solutions also fall into the scope of the invention, and the patent protection scope of the invention should be defined by the enclosed claims.

The invention claimed is:

1. A testing probe for testing a liquid crystal screen, comprising:
   a base,
   a plurality of non-coaxial elastic extensible elements; and
   a probe needle disposed on the base through the elastic extensible elements, wherein one end of the probe needle is for being electrically connected to a detecting signal line of a testing device, and the other end of the probe needle is for being electrically connected to a testing area of the liquid crystal screen to collect signals from the testing area of the liquid crystal screen to test a parameter of the liquid crystal screen,
   wherein at least one of the elastic extensible elements is in a stretched state.

2. The testing probe according to claim 1, wherein the probe needle contacts the base under effect of tension of the elastic extensible elements.

3. The testing probe according to claim 2, wherein the base has a depression, and the elastic extensible elements are disposed at the depression.

4. The testing probe according to claim 3, wherein the depth of the depression is larger than the height of the elastic extensible elements in a nature state.

5. The testing probe according to claim 4, wherein the longitudinal section of the base is of an L-like shape or is concave.

6. The testing probe according to claim 1, wherein the plurality of elastic extensible elements comprise a first elastic extensile element stretched and a second elastic extensile element compressed, the probe needle is disposed on the base through the first elastic extensile element stretched and the second elastic extensile element compressed.

7. The testing probe according to claim 1, wherein the probe needle includes a needle rod portion and a needle head portion, and the range of the angle between the needle rod portion and the needle head portion is from 90 degree to 160 degree.

8. The testing probe according to claim 1, wherein the needle tip of the probe needle is at the same level with the bottom of the base or below the level.

9. The testing probe according to claim 1, further including a probe needle carrier for carrying the probe needle, and through the probe needle carrier, the probe needle connects with the elastic extensible elements and is disposed on the base.

10. A testing device, including the testing probe according to claim 1.

* * * * *